(12) United States Patent
Chen

(10) Patent No.: US 10,585,315 B2
(45) Date of Patent: Mar. 10, 2020

(54) DISPLAY PANEL AND DISPLAY APPARATUS THEREOF

(71) Applicants: HKC Corporation Limited, Shenzhen, Guangdong (CN); Chongqing HKC Optoelectronics Technology Co., Ltd., Chongqing (CN)

(72) Inventor: Yu-Jen Chen, Chongqing (CN)

(73) Assignees: HKC CORPORATION LIMITED, Shenzhen, Guangdong (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 81 days.

(21) Appl. No.: 15/735,369

(22) PCT Filed: Jul. 3, 2017

(86) PCT No.: PCT/CN2017/091474
§ 371 (c)(1),
(2) Date: Dec. 11, 2017

(87) PCT Pub. No.: WO2018/161481
PCT Pub. Date: Sep. 13, 2018

(65) Prior Publication Data
US 2019/0011754 A1  Jan. 10, 2019

(30) Foreign Application Priority Data
Mar. 10, 2017 (CN) .......................... 2017 1 0144393

(51) Int. Cl.
*G02F 1/1345* (2006.01)
*H01L 27/12* (2006.01)
(Continued)

(52) U.S. Cl.
CPC ........ *G02F 1/13452* (2013.01); *G02F 1/1368* (2013.01); *G02F 1/133308* (2013.01);
(Continued)

(58) Field of Classification Search
CPC ............. G02F 1/13452; G02F 1/13306; H01L 27/3276; H01L 27/3246
See application file for complete search history.

(56) References Cited

U.S. PATENT DOCUMENTS

2012/0033397 A1* 2/2012 Park ................. G02F 1/133308
361/808
2013/0342099 A1 12/2013 Weber et al.
(Continued)

FOREIGN PATENT DOCUMENTS

CN  102736349 A  10/2012
CN  104133307 A  11/2014
(Continued)

*Primary Examiner* — Karabi Guharay
(74) *Attorney, Agent, or Firm* — Muncy, Geissler, Olds & Lowe, P.C.

(57) ABSTRACT

The present invention relates to a display panel and display apparatus thereof. The display panel comprises: a first substrate having an outer surface and an inner surface, wherein a bonding region is formed on a peripheral region of the outer surface, a plurality of through micro-holes are formed on the bonding region, a conductive material is filled in the through micro-holes, and an electrode layer is formed on the inner surface; and a flexible printed circuit (FPC) film is electrically connecting the bonding region and electrode layer on the inner surface of the first substrate by the conductive material.

9 Claims, 6 Drawing Sheets

(51) Int. Cl.
 *G02F 1/1335* (2006.01)
 *G02F 1/1368* (2006.01)
 *G02F 1/1333* (2006.01)

(52) U.S. Cl.
 CPC .. *G02F 1/133514* (2013.01); *G02F 1/133528* (2013.01); *G02F 1/133608* (2013.01); *H01L 27/124* (2013.01)

(56) References Cited

U.S. PATENT DOCUMENTS

2014/0063393 A1* 3/2014 Zhong ................ G02F 1/13306
 349/42
2016/0329386 A1* 11/2016 Sauers ................ H01L 27/3276

FOREIGN PATENT DOCUMENTS

| CN | 105138161 A | 12/2015 |
| CN | 106896599 A | 6/2017 |
| JP | 2002040472 A | 2/2002 |

* cited by examiner

DISPLAY PANEL AND DISPLAY APPARATUS THEREOF

BACKGROUND OF THE INVENTION

Field of Invention

The present invention generally relates to a display panel and display apparatus thereof, and especially to a narrow bezel type display panel with a connection location between a glass substrate and a flexible printed circuit (FPC) film.

Description of Related Art

A thin-film transistor (TFT) liquid crystal display (LCD) TFT-LCD is abbreviated to a TFT-LCD. A TFT-LCD is a backlight type liquid crystal display (LCD) composed of a liquid crystal display panel and a backlight module. A liquid crystal display panel comprises: a first substrate, such as a thin-film transistor (TFT) substrate; a second substrate, such as a color filter (CF) substrate; and a plurality of liquid crystals encapsulated between the thin-film transistor (TFT) substrate and the color filter (CF) substrate. Based on exterior appearance requirements of the thin-film transistor (TFT) liquid crystal display (LCD) in current market, a TFT-LCD is gradually developed to a new no-bezel type design or a narrow bezel type design for more emphasizing a whole clear image with overall viewing user experience. Generally speaking, according to a current liquid crystal display (LCD) apparatus, for assembling a first substrate (for example, a thin film transistor (TFT) substrate) and a second substrate (for example, a color filter (CF) substrate), the first substrate (thin-film transistor substrate) needs to reserve enough spaces for heat pressing and bonding gold bumps of IC chips and inner leads of a flexible printed circuit (FPC) film, for easily using the flexible printed circuit (FPC) film as a carrier for the packaged IC chips. As a result, one side of a current first substrate (thin film transistor substrate) must protrude out of the second substrate (color filter substrate) for a predetermined distance. That is, an outer lead bonding (OLB) region is accordingly formed for connecting the flexible printed circuit (FPC) film and the gold bumps of IC chips.

For example, a first substrate (thin film transistor substrate) usually needs to be wider than a second substrate (color filter substrate) for setting an outer lead bonding (OLB) region used for bonding a flexible printed circuit (FPC) film and further connecting driving circuits during assembling. However, since a width of the first substrate increases for forming the outer lead bonding (OLB) region, a liquid crystal glass accordingly increases its usage amount. Therefore, a display product cannot reach to be a truly narrow bezel one, also resulting in a bad effect for an exterior appearance of the display product.

SUMMARY OF THE INVENTION

For resolving the technical problems above-mentioned, the objects of the present invention are to provide a display panel and display apparatus thereof, especially to a narrow bezel type display panel with a connection location between a glass substrate and a flexible printed circuit (FPC) film. The display panel and display apparatus of the present invention can improve and increase a cutting usage rate of a glass substrate, increasing economic benefits, and further providing a more beautiful narrow bezel product.

The objects and technical solutions of the present invention are implemented by following technical ways and means. In one perspective, a display panel according to the present invention comprises: a first substrate having an outer surface and an inner surface, wherein a bonding region is formed on a peripheral region of the outer surface, a plurality of through micro-holes are formed on the bonding region, a conductive material is filled in the through micro-holes, and an electrode layer is formed on the inner surface; and a flexible printed circuit (FPC) film electrically is connected to the bonding region, and is electrically connected to the electrode layer on the inner surface of the first substrate by the conductive material.

The objects and technical solutions of the present invention can be further implemented by following technical ways and means.

In one embodiment of the present invention, the first substrate is a thin film transistor (TFT) substrate, the second substrate being a color filter (CF) substrate, and a width of the first substrate and a width of the second substrate are the same.

In one embodiment of the present invention, the conductive material includes a metal material, and the through micro-holes are formed by a Laser-reaming process.

In another perspective, a display apparatus according to the present invention comprises: a backlight module and a display panel. The display panel comprises: a first substrate having an outer surface and an inner surface, wherein a bonding region is formed on a peripheral region of the outer surface, a plurality of through micro-holes are formed on the bonding region, a conductive material is filled in the through micro-holes, and an electrode layer is formed on the inner surface; and a flexible printed circuit (FPC) film is electrically connected to the bonding region, and is electrically connected to the electrode layer on the inner surface of the first substrate by the conductive material.

In one embodiment of the present invention, the backlight module is a direct-lighting type backlight module.

In one embodiment of the present invention, the present display apparatus further comprising: a front bezel, a sealing glue bezel, and a backplane for receiving the backlight module; the front bezel set against a second polarizer of the display panel, the sealing glue bezel set against the first substrate of the display panel, and the backplane combining with the sealing glue bezel to form a receiving space for accommodating the backlight module; a relying surface protruded horizontally from a horizontal surface of the sealing glue bezel, a relying surface protruded horizontally from a horizontal surface of the sealing glue bezel, the relying surface higher than the horizontal surface and adhering to the peripheral region of the bonding region of the first substrate, and a flexible printed circuit (FPC) film bonding space defined between the horizontal surface and the bonding region on the outer surface of the first substrate.

In one embodiment of the present invention, the present display apparatus further comprising: a front bezel, a sealing glue bezel, and a backplane for receiving the backlight module; the front bezel set against a second polarizer of the display panel, the sealing glue bezel set against a first polarizer of the display panel, and the backplane combining with the sealing glue bezel to form a receiving space for accommodating the backlight module; a horizontal surface of the sealing glue bezel adhering to the first polarizer, and a flexible printed circuit (FPC) film bonding space defined between the horizontal surface and the outer surface of the first substrate.

In another perspective, the present invention further provides a display apparatus, comprising: a backlight module and a display panel. The display panel comprises: a thin-film transistor (TFT) substrate having an outer surface and an inner surface, wherein a bonding region is formed on the outer surface, a plurality of through micro-holes are formed on the bonding region, a copper material is filled in the through micro-holes, and an electrode layer is formed on the inner surface; a flexible printed circuit (FPC) film is electrically connected to the bonding region, and is electrically connected to the electrode layer on the inner surface of the thin-film transistor (TFT) substrate by the copper material; and a color filter (CF) substrate is disposed opposite to the thin film transistor (TFT) substrate, wherein a width of the thin film transistor (TFT) substrate and a width of the color filter (CF) substrate are the same. The present display apparatus further comprises: a front bezel, the front bezel set against a second polarizer of the display panel; a sealing glue bezel, the sealing glue bezel set against the first polarizer of the display panel and a horizontal surface of the sealing glue bezel adhering to the first polarizer, and a flexible printed circuit (FPC) film bonding space defined between the horizontal surface and the outer surface of the thin film transistor (TFT) substrate; and a backplane, the backplane combining with the sealing glue bezel to form a receiving space for accommodating the backlight module.

The present invention is based on a traditional glass substrate to form a plurality of through micro-holes on the glass substrate by a Laser-reaming technique. Then a conductive material (can be but not limited to a metal material, a silver conducting paste, or a variety of anisotropic conductive adhesives, etc.) is filled in through micro-holes, so that the flexible printed circuit (FPC) film can electrically connect the electrode layer on the inner surface of the first substrate (thin film transistor (TFT) substrate) to control driving IC chips. A width of the first substrate (thin film transistor (TFT) substrate) for a traditional outer lead bonding (OLB) region can accordingly be saved or eliminated. Therefore, a narrow bezel type display apparatus is improved. Meanwhile, as the width of the traditional outer lead bonding (OLB) region is reduced, a cutting usage rate of a glass substrate is accordingly increased. Economic benefits of the present invention are also increased, since a glass substrate can be cut into more display panels or larger display panels using the same size of a traditional glass substrate.

DESCRIPTION OF THE PREFERRED EMBODIMENTS

Figure 1A:
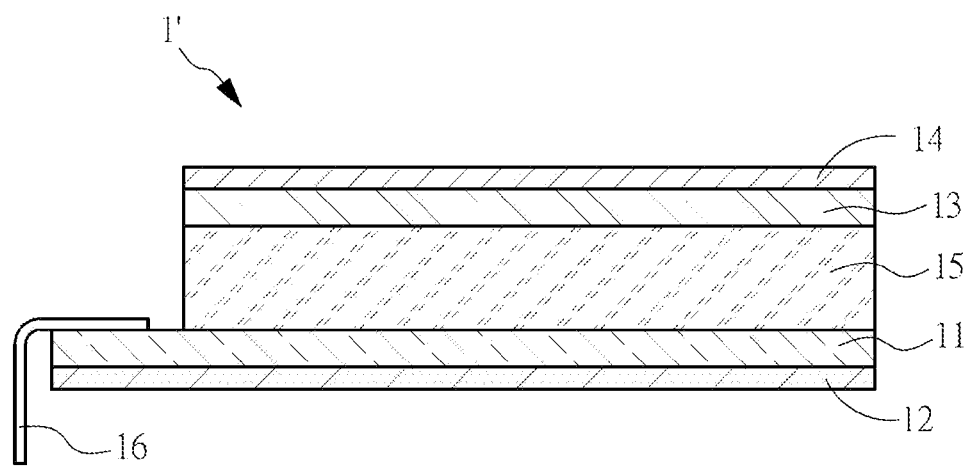
FIG. 1a shows a traditional example structure of a flexible printed circuit (FPC) film connecting a liquid crystal display (LCD) panel.

The drawings as referred to throughout the description of the present invention are examples for implementing the objects of the present invention. The orientation words or terms used in the description of the present invention, such as "above", "under", "forward", "backward", "left", "right", "inner", "outer", "side", etc. are examples in the drawings for illustrative purpose only, or just show the interrelations between the components, but not to be construed as limitations to the scope of the present invention.

The drawings and the description of the present invention are deemed to be examples but not limitations essentially. In the drawings, components or elements having similar or same structure are marked with the same numbers. In addition, sizes and thicknesses of every component or element are just examples, but not drawn according to actual scale and not read as limitations to the scope of the present invention.

In drawings of the present invention, sizes and thicknesses of layers, films, panels, or regions are emphasized for clearness, easy to describe and easy to understand. Therefore, some layers, films, or regions are emphasized but not drawn according to their actual scales. It is to be understood that, for example, when one of the components of layers, films, regions, or substrate are "on" another component of layers, films, regions, or substrate, the one of the components of layers, films, regions, or substrate could be adjacent on another component of layers, films, regions, or substrate directly, or there could be other inter-components of layers, films, regions, or substrate set therebetween.

Furthermore, in the description of the present invention, a word "comprising" or "including" is construed to comprise or include the related components but not exclude other components, except there is clearly opposite word or description in the present invention. And, in the description of the present invention, a word "on" can be construed to be above or under a target component, but not only construed to be on a top of the target component in vertical or gravity direction.

For further clarifying the technical solutions or functions of the present invention to implement the objects of the present invention, a liquid crystal display panel and manufacturing method thereof, and their specific implementations, structures, features and functions, according to a preferred embodiment of the present invention will be apparent from the following detailed description, which proceeds with reference to the accompanying drawings.

A liquid crystal display (LCD) includes liquid crystals set between two glass substrates, wherein the liquid crystals are applied with an electric field, so that an image or numbers can be shown. The liquid crystals are composed of a kind of material between liquid and solid. Since the liquid crystal display (LCD) cannot emit light by itself, the liquid crystal display (LCD) needs a backlight module for providing light and is driven by a printed circuit board (PCB) electrically connected with the liquid crystal display (LCD). An image can be shown by controlling the light passing through the liquid crystal display (LCD) panel, wherein liquid crystals are set within the liquid crystal display (LCD) uniformly.

Figure 1B:
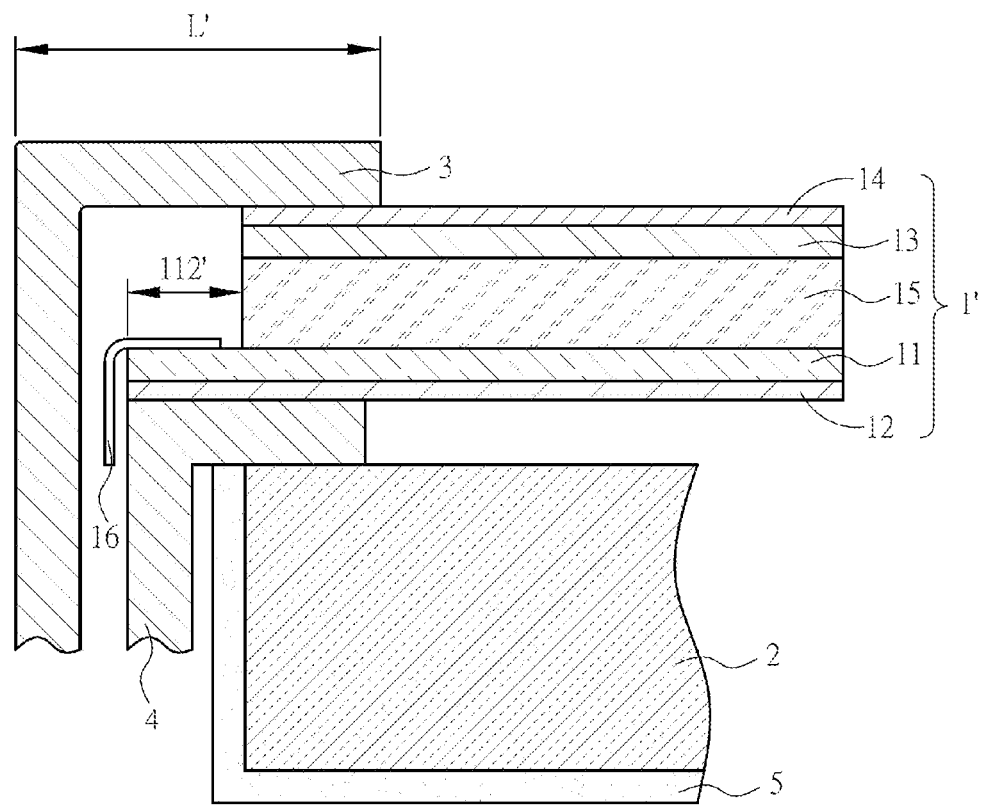
FIG. 1b shows a top view illustrating a traditional example of an assembled structure of a liquid crystal display (LCD) apparatus.

An example of a liquid crystal display panel 1' is shown in FIGS. 1a and 1b, wherein FIG. 1a shows a traditional example structure of a flexible printed circuit (FPC) film connected to a liquid crystal display (LCD) panel, and FIG. 1b shows a top view illustrating a traditional example of an assembled structure of a liquid crystal display (LCD) apparatus. The liquid crystal display panel 1' comprises: a first substrate 11, a second substrate 13, and a liquid crystal layer 15 encapsulated between the first substrate 11 and the second substrate 13, and a first polarizer 12 and a second polarizer 14 are formed on surfaces of the first substrate 11 and the second substrate 13 opposite to the liquid crystal layer 15 respectively. The first polarizer 12 and a second polarizer 14 are used for controlling a polarization direction of light, so that the liquid crystal display (LCD) can show an image with different brightness and darkness by applying outside electric fields.

According to an example of present liquid crystal display (LCD) apparatus, for assembling a first substrate 11 (thin film transistor (TFT) substrate) and a second substrate 13 (color filter substrate), the first substrate 11 (thin film transistor (TFT) substrate) needs to reserve enough spaces for heat pressing and bonding gold bumps of IC chips and inner leads of a flexible printed circuit (FPC) film 16, for easily using the flexible printed circuit (FPC) film 16 as a carrier for the packaged IC chips. As a result, one side of the first substrate 11 (thin-film transistor (TFT) substrate) must protrude out of the second substrate 13 (color filter substrate) for a predetermined distance. That is, an outer lead bonding (OLB) region 112' is accordingly formed for connecting the flexible printed circuit (FPC) film 16 and the gold bumps of IC chips.

An example of the first substrate 11 (thin film transistor (TFT) substrate) should be wider than the second substrate 13 (color filter substrate), for setting the outer lead bonding (OLB) region 112' for bonding the flexible printed circuit (FPC) film 16 and further connecting driving circuits during assembling. However, a usage of a liquid crystal glass is increased and a narrow bezel display product cannot be reached, even an exterior appearance of the narrow bezel display product will be influenced or downgraded since a width increased by the outer lead bonding (OLB) region 112'.

Accordingly, as the above-mentioned, when the liquid crystal display panel 1' combining a front bezel 3 and a sealing glue bezel 4 are clamped against each other, and combining a backplane 5 accommodating a backlight module 2, an example of a liquid crystal display (LCD) apparatus is formed, and a size of the front bezel 3 with a length L' is shown in FIG. 1b, and has a bad exterior appearance.

Figure 2A:
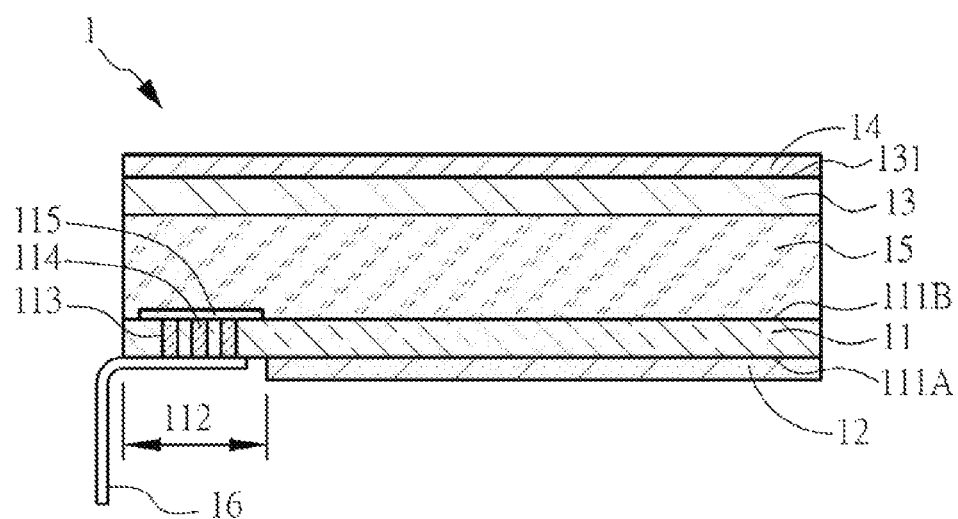
FIG. 2a shows a cross-sectional view illustrating a connection structure of a flexible printed circuit (FPC) film for a display panel according to one embodiment of the present invention.

In one embodiment of the present invention, a display panel of the present invention can be a display panel 1, such as a liquid crystal display panel, an organic light-emitting diode (OLED) display panel, or other display panels, as shown in FIG. 2a. The present display panel 1 comprises: a first substrate 11 having an outer surface 111A and an inner surface 111B, wherein a bonding region 112 is formed on a peripheral region of the outer surface 111A, a plurality of through micro-holes 113 are formed on the bonding region 112, a conductive material 114 is filled in the through micro-holes 113, and an electrode layer 115 is formed on the inner surface 111B; a first polarizer 12 formed on the outer surface 111A of the first substrate 11; a second substrate 13 set opposite to the first substrate 11 and having an outer surface 131; a second polarizer 14 formed on the outer surface 131 of the second substrate 13; a liquid crystal layer 15 set between the first substrate 11 and the second substrate 13; and a flexible printed circuit (FPC) film 16 electrically connected to the bonding region 112, and electrically connected to the electrode layer 115 on the inner surface 111B of the first substrate 11 by the conductive material 114. For example, the flexible printed circuit (FPC) film 16 electrically connects with the bonding region 112 by a silver conducting paste or a variety of conductive adhesives, preferably an anisotropic conductive adhesives (ACA).

In one embodiment of the present invention, the first substrate 11 is preferred to be a thin film transistor (TFT) substrate, and the second substrate 13 is preferred to be a color filter (CF) substrate. Since the bonding region 112 (that is, an outer lead bonding (OLB) region) of the first substrate 11 (the thin film transistor substrate) does not increase a width of the first substrate 11, the width of the first substrate 11 and the width of the second substrate 13 are the same.

In one embodiment of the present invention, the conductive material 114 can include but is not limited to a metal material, such as copper.

In one embodiment of the present invention, the through micro-holes 113 are formed by a Laser-reaming process.

Figure 2B:
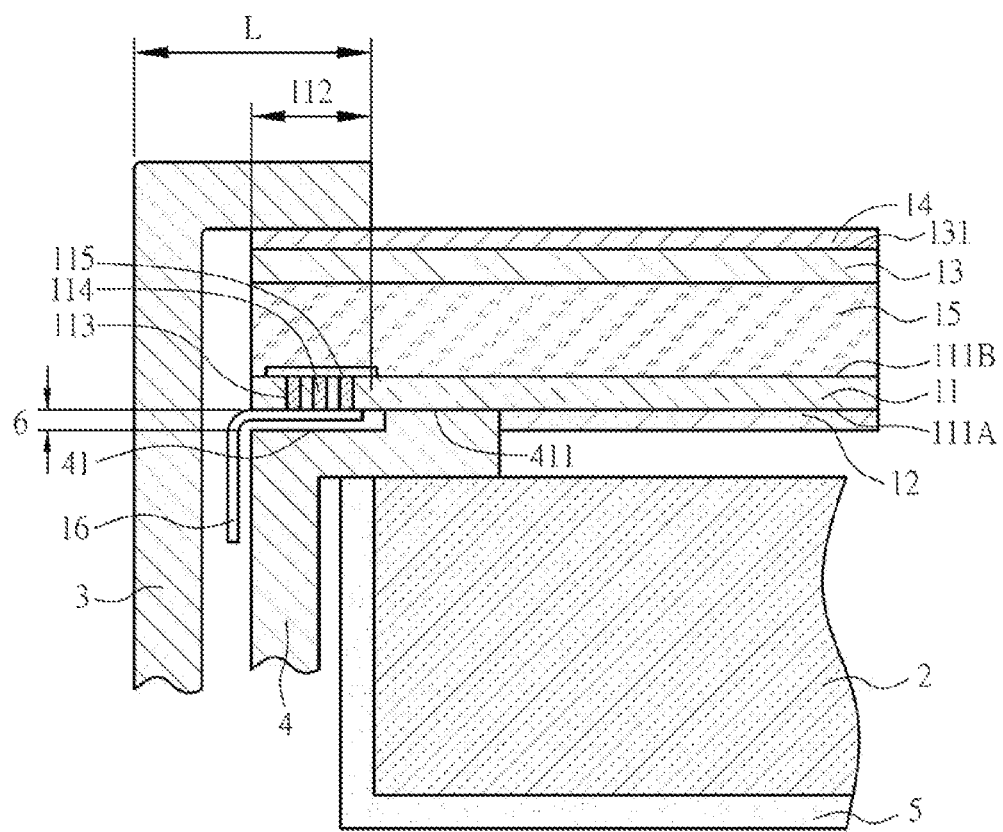
FIG. 2b shows a top view illustrating a connection structure of a flexible printed circuit (FPC) film for a display apparatus according to one embodiment of the present invention.

In one embodiment of the present invention, the present narrow bezel type display panel 1 can combine with a backlight module 2 to form a display apparatus, as shown in FIG. 2b, showing a connection structure of a flexible printed circuit (FPC) film of a display apparatus according to a second embodiment of the present invention.

In one embodiment of the present invention, the present invention provides a display apparatus, comprising: a first substrate 11 having an outer surface 111A and an inner surface 111B, wherein a bonding region 112 is formed on a peripheral region of the outer surface 111A, a plurality of through micro-holes 113 are formed on the bonding region 112, a conductive material 114 is filled in the through micro-holes 113, an electrode layer 115 is formed on the inner surface 111B; a first polarizer 12 formed on the outer surface 111A of the first substrate 11; a second substrate 13 set opposite to the first substrate 11, and the second substrate 13 having an outer surface 131; a second polarizer 14 formed on the outer surface 131 of the second substrate 13; a liquid crystal layer 15 set between the first substrate 11 and the second substrate 13; and a flexible printed circuit (FPC) film 16 electrically connected to the bonding region 112, and electrically connected to the electrode layer 115 on the inner surface 111B of the first substrate 11 by the conductive material 114 (for example, a flexible printed circuit (FPC) film 16 electrically connected to the bonding region 112 by a silver conducting paste or a variety of conductive adhesives, preferably an anisotropic conductive adhesives (ACA)); and a backlight module 2, for example, the backlight module is a direct-lighting type backlight module.

In one embodiment of the present invention, the first substrate 11 is preferred to be a thin film transistor (TFT) substrate, and the second substrate 13 is preferred to be a color filter (CF) substrate. Since the bonding region 112 (that is, an outer lead bonding (OLB) region) of the first substrate 11 (the thin film transistor substrate) does not increase a width of the first substrate 11, the width of the first substrate 11 and the width of the second substrate 13 are the same.

In one embodiment of the present invention, the conductive material 114 can include but is not limited to a metal material, such as copper.

In one embodiment of the present invention, the through micro-holes 113 are formed by a Laser-reaming process.

In one embodiment of the present invention, the present invention further comprises a front bezel 3, a sealing glue bezel 4 and a backplane 5 accommodating a backlight module 2; wherein the front bezel 3 is set against the second polarizer 14 of the display panel 1, the sealing glue bezel 4 is set against the first substrate 11 of the display panel 1, the backplane 5 combining with the sealing glue bezel 4 to form a receiving space for accommodating the backlight module 2. A relying surface 411 is protruded horizontally from a horizontal surface 41 of the sealing glue bezel 4, wherein the relying surface 411 is slightly higher than the horizontal surface 41 and adheres to the peripheral region of the bonding region 112 of the first substrate 11, and a flexible printed circuit (FPC) film bonding space 6 is defined between the horizontal surface 41 and the bonding region 112 on the outer surface 111A of the first substrate 11.

In the embodiment of the present invention, since peripheral regions of the first substrate 11 and the second substrate 13 are aligned to each other, a size of the front bezel 3 is only a length of L for fixing a display panel when assembling a narrow bezel type display apparatus. Therefore, a narrow bezel type display apparatus can be achieved. The present narrow type display apparatus can reduce shaded areas of a display panel to improve a display panel usage rate, and can also satisfy exterior appearance requirements of the thin film transistor (TFT) liquid crystal display (LCD) in current market to emphasize a whole clear image with good user experience.

Figure 2C:
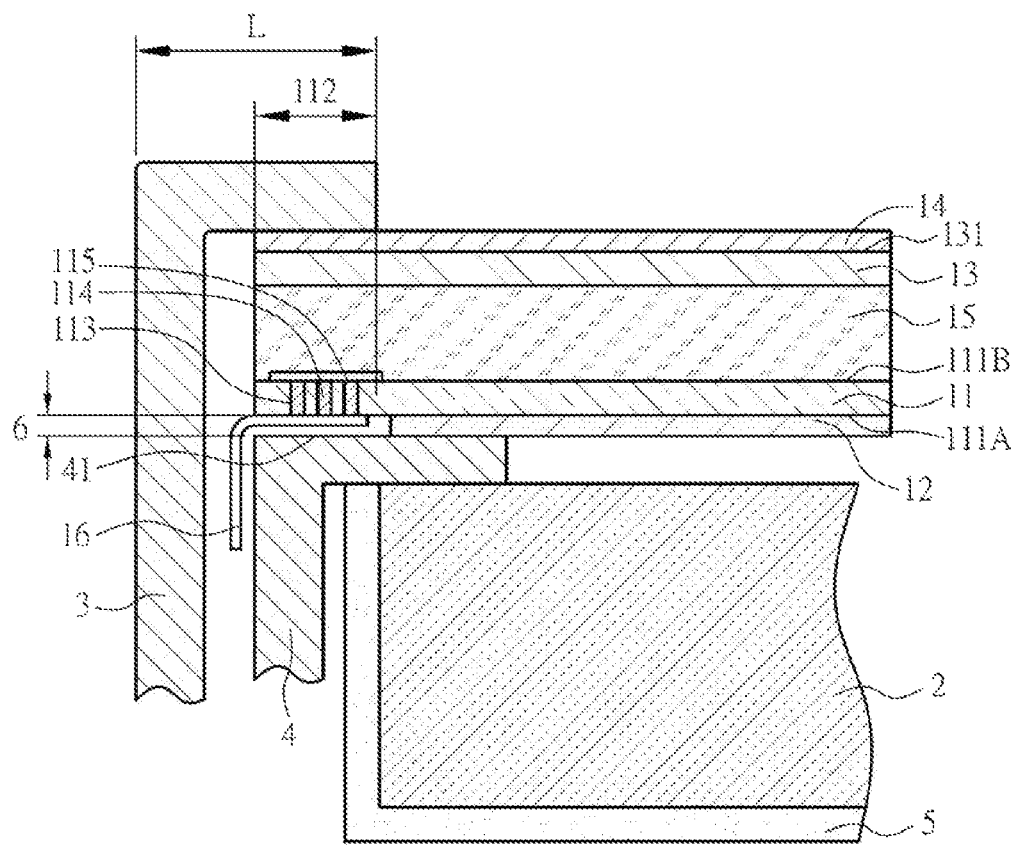
FIG. 2c shows a top view illustrating a connection structure of a flexible printed circuit (FPC) film for a display apparatus according to another embodiment of the present invention.

FIG. 2c shows a top view illustrating a connection structure of a flexible printed circuit (FPC) film for a display apparatus according to another embodiment of the present invention. Please refer to FIG. 2c, the present display apparatus comprises: a first substrate 11 having an outer surface 111A and an inner surface 111B, wherein a bonding region 112 is formed on a peripheral region of the outer surface 111A, a plurality of through micro-holes 113 are formed on the bonding region 112, a conductive material 114 is filled in the through micro-holes 113, and an electrode layer 115 is formed on the inner surface 111B; a first polarizer 12 is formed on the outer surface 111A of the first substrate 11; a second substrate 13 is disposed opposite to the first substrate 11 and having an outer surface 131; a second polarizer 14 is formed on the outer surface 131 of the second substrate 13; a liquid crystal layer 15 is disposed between the first substrate 11 and the second substrate 13; and a flexible printed circuit (FPC) film 16 electrically connected to the bonding region 112, and connected to with the electrode layer 115 on the inner surface 111B of the first substrate 11 by conductive material 114 (for example, the flexible printed circuit (FPC) film 16 electrically connected to the bonding region 112 by a silver conducting paste or a variety of conductive adhesives, preferably anisotropic conductive adhesives); and a backlight module 2, the backlight module 2 can be, for example, a direct-lighting type backlight module.

In one embodiment of the present invention, the first substrate 11 is preferred to be a thin film transistor (TFT) substrate, the second substrate 13 is preferred to be a color filter (CF) substrate. Since the bonding region 112 (that is, an outer lead bonding (OLB) region) of the first substrate 11 (the thin film transistor substrate) does not increase a width of the first substrate 11, the width of the first substrate 11 and the width of the second substrate 13 are the same.

In one embodiment of the present invention, the conductive material 114 can include but is not limited to a metal material, such as copper.

In one embodiment of the present invention, the through micro-holes 113 are formed by a Laser-reaming process.

In one embodiment of the present invention, the present invention further comprises a front bezel 3, a sealing glue bezel 4 and a backplane 5 accommodating a backlight module 2. The front bezel 3 is set against the second polarizer 14 of the display panel 1, the sealing glue bezel 4 is set against the first polarizer 12 of the display panel 1, the backplane 5 combines with the sealing glue bezel 4 to form a receiving space for accommodating the backlight module 2, a horizontal surface 41 of the sealing glue bezel 4 adheres to the first polarizer 12, and a flexible printed circuit (FPC) film bonding space 6 is defined between the horizontal surface 41 and the outer surface 111A of the first substrate 11.

In the embodiment of the present invention, since peripheral regions of the first substrate 11 and the second substrate 13 are aligned to each other, a size of the front bezel 3 is only a length of L for fixing a display panel when assembling a narrow bezel type display apparatus. Therefore, a narrow bezel type display apparatus can be achieved. The present narrow type display apparatus can reduce shaded areas of a display panel to improve a display panel usage rate, and can also satisfy exterior appearance requirements of the thin film transistor (TFT) liquid crystal display (LCD) in current market to emphasize a whole clear image with good user experience.

Figure 3:
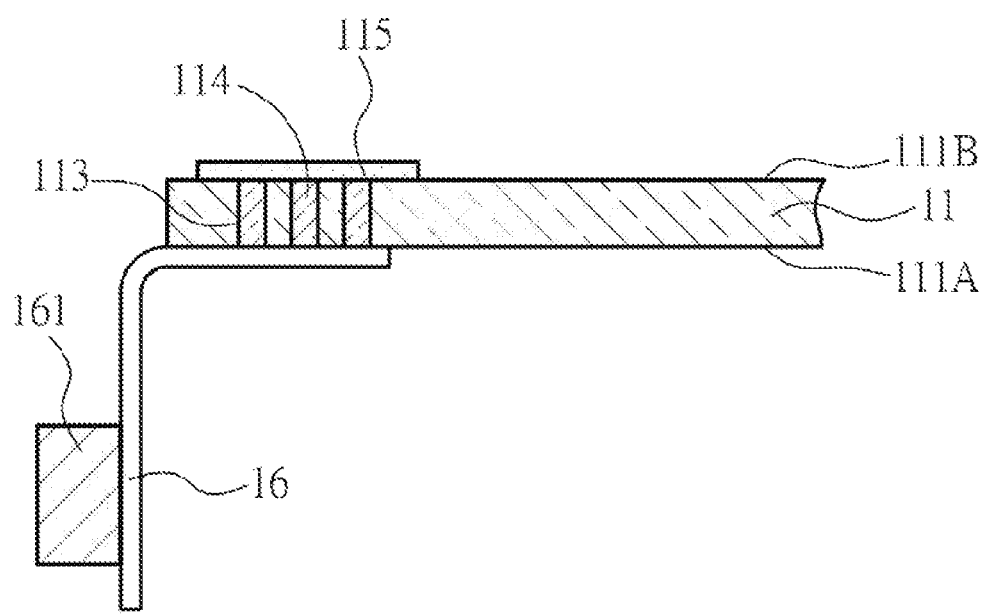
FIG. 3 shows a cross-sectional view illustrating a coupling structure of a flexible printed circuit (FPC) film and a driving integrated circuit (IC) according to one embodiment of the present invention.

FIG. 3 shows a cross-sectional view illustrating a coupling structure of a flexible printed circuit (FPC) film and a driving integrated circuit (IC) according to one embodiment of the present invention. Please refer to FIG. 3, as shown in FIG. 3, a plurality of through micro-holes 113 are formed on the first substrate 11, and a conductive material 114 is filled in the through micro-holes 113. Therefore, a flexible printed circuit (FPC) film 16 electrically connected to the outer surface 111A of the first substrate 11 can electrically connect the electrode layer 115 on the inner surface 111B of the first substrate 11 by the conductive material 114 for achieving driving circuit effect for a driving IC chip 161.

In one embodiment of the present invention, the first substrate 11 is preferred to be a thin film transistor (TFT) substrate.

In one embodiment of the present invention, the conductive material 114 can include but is not limited to a metal material, such as copper.

In one embodiment of the present invention, the through micro-holes 113 are formed by a Laser-reaming process.

In one embodiment of the present invention, the present invention provides a display apparatus comprising: a backlight module 2; a display panel 1, comprising: a thin film transistor (TFT) substrate (a foregoing first substrate 11) having an outer surface 111A and an inner surface 111B, wherein a bonding region 112 is formed on a peripheral region of the outer surface, a plurality of through micro-holes 113 are formed on the bonding region 112, a copper (a foregoing conductive material 114) is filled in the through micro-holes 113, and an electrode layer 115 is formed on the inner surface 111B; a flexible printed circuit (FPC) film 16 is electrically connected to the bonding region 112, and is electrically connected to the electrode layer 115 on the inner surface 111B of the thin film transistor (TFT) substrate by the copper; a color filter (CF) substrate (a foregoing second substrate 12) is disposed opposite to the thin film transistor (TFT) substrate, a width of the thin film transistor (TFT) substrate and a width of the color filter (CF) substrate are the same; a front bezel 3 set against the second polarizer 14 of the display panel 1; a sealing glue bezel 4 set against the first polarizer 12 of the display panel, a horizontal surface of the sealing glue bezel 4 adhering to the first polarizer 12, and a flexible printed circuit (FPC) film bonding space 6 defined between the horizontal surface and the outer surface 111A of the thin film transistor (TFT) substrate; and a backplane 5, the backplane 5 combining with the sealing glue bezel 4 to form a receiving space for accommodating the backlight module 2.

The present invention is based on a traditional glass substrate to form a plurality of through micro-holes 113 on the glass substrate by a Laser-reaming technique. Then a conductive material (can be but not limited to a metal material, a silver conducting paste, or a variety of anisotropic conductive adhesives, etc.) is filled in through micro-holes 113, so that the flexible printed circuit (FPC) film can electrically connect the electrode layer on the inner surface of the first substrate (thin film transistor (TFT) substrate) to control driving IC chips. A width of the first substrate (thin film transistor (TFT) substrate) for a traditional outer lead bonding (OLB) region can accordingly be saved or eliminated. Therefore, a narrow bezel type display apparatus is improved. In a meanwhile, as the width of the traditional outer lead bonding (OLB) region is reduced, a cutting usage rate of a glass substrate is accordingly increased, and economic benefits of the present invention are also increased since a glass substrate can be cut into more display panels or larger display panels using the same size of a traditional glass substrate.

"In some embodiments of the present invention" and "In a variety of embodiments of the present invention" are used repeatedly through the description. They usually mean different embodiments. However, they can also mean the same embodiments. "Comprising", "having" and "including" are synonyms, except it is noted to be different or has other meaning before and after its description.

The present invention has been described in considerable detail with reference to certain preferred embodiments thereof. It should be understood that the description is for illustrative purpose, not for limiting the scope of the present invention. Those skilled in this art can readily conceive simple or equivalent variations and modifications, which are still within the spirit of the present invention.

What is claimed is:

1. A display apparatus, comprising:
a backlight module; and
a display panel, comprising:
a first substrate having an outer surface and an inner surface, wherein a bonding region is formed on a peripheral region of the outer surface, a plurality of through micro-holes are formed on the bonding region, a conductive material is filled in the through micro-holes, and an electrode layer is formed on the inner surface; and
a flexible printed circuit (FPC) film is electrically connected to the bonding region, and is electrically connected to the electrode layer on the inner surface of the first substrate by the conductive material; and
a front bezel, a sealing glue bezel, and a backplane for receiving the backlight module; the front bezel set against a second polarizer of the display panel, the sealing glue bezel set against the first substrate of the display panel, and the backplane combining with the sealing glue bezel to form a receiving space for accommodating the backlight module,
wherein a relying surface is protruded horizontally from a horizontal surface of the sealing glue bezel, the relying surface is higher than the horizontal surface and adheres to the peripheral region of the bonding region of the first substrate, and a flexible printed circuit (FPC) film bonding space is defined between the horizontal surface and the bonding region on the outer surface of the first substrate.

2. The display apparatus according to claim 1, wherein the backlight module is a direct-lighting type backlight module.

3. A display apparatus, comprising:
a backlight module; and
a display panel, comprising:
a first substrate having an outer surface and an inner surface, wherein a bonding region is formed on a peripheral region of the outer surface, a plurality of through micro-holes are formed on the bonding region, a conductive material is filled in the through micro-holes, and an electrode layer is formed on the inner surface; and
a flexible printed circuit (FPC) film is electrically connected to the bonding region, and is electrically connected to the electrode layer on the inner surface of the first substrate by the conductive material; and
a front bezel, a sealing glue bezel, and a backplane for receiving the backlight module; the front bezel set against a second polarizer of the display panel, the sealing glue bezel set against the first polarizer of the display panel, and the backplane combining with the sealing glue bezel to form a receiving space for accommodating the backlight module,
wherein a horizontal surface of the sealing glue bezel adheres to the first polarizer, and a flexible printed circuit (FPC) film bonding space is defined between the horizontal surface and the outer surface of the first substrate.

4. The display apparatus according to claim 3, wherein the first substrate is a thin film transistor (TFT) substrate.

5. The display apparatus according to claim 4, wherein a width of the first substrate and a width of the second substrate are the same.

6. The display apparatus according to claim 3, wherein the second substrate is a color filter (CF) substrate.

7. The display apparatus according to claim 3, wherein the conductive material includes a metal material.

8. The display apparatus according to claim 3, wherein the through micro-holes are formed by a Laser-reaming process.

9. A display apparatus, comprising:
a backlight module;
a display panel, comprising:
a thin-film transistor (TFT) substrate having an outer surface and an inner surface, a bonding region formed on the outer surface, a plurality of through micro-holes formed on the bonding region, a copper material filled in the through micro-holes, and an electrode layer formed on the inner surface;
a flexible printed circuit (FPC) film electrically connected to the bonding region, and electrically connected to the electrode layer on the inner surface of the thin-film transistor (TFT) substrate by the copper material; and
a color filter (CF) substrate set opposite to the thin film transistor (TFT) substrate, wherein a width of the thin film transistor (TFT) substrate and a width of the color filter (CF) substrate are the same;
a front bezel, the front bezel set against a second polarizer of the display panel;
a sealing glue bezel, the sealing glue bezel set against athe first polarizer of the display panel and a horizontal surface of the sealing glue bezel adhering to the first polarizer, and a flexible printed circuit (FPC) film bonding space defined between the horizontal surface and the outer surface of the thin film transistor (TFT) substrate; and a backplane, the backplane combining with the sealing glue bezel to form a receiving space for accommodating the backlight module.

* * * * *